(12) United States Patent
Li et al.

(10) Patent No.: US 7,166,535 B2
(45) Date of Patent: Jan. 23, 2007

(54) PLASMA ETCHING OF SILICON CARBIDE (75) Inventors: Si Yi Li, Fremont, CA (US); S. M. Reza Sadjadi, Saratoga, CA (US); James V. Tietz, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 122 days.

(21) Appl. No.: 10/430,013

(22) Filed: May 6, 2003

(65) Prior Publication Data

US 2003/0199170 A1    Oct. 23, 2003

Related U.S. Application Data

(63) Continuation of application No. 09/820,696, filed on Mar. 30, 2001, now abandoned.

(51) Int. Cl.
*H01L 21/461* (2006.01)
*H01L 21/302* (2006.01)

(52) U.S. Cl. ............... 438/706; 438/707; 438/714; 438/719

(58) Field of Classification Search ............ None
See application file for complete search history.

(56) References Cited

U.S. PATENT DOCUMENTS

| | | | |
|---|---|---|---|
| 3,398,033 A | 8/1968 | Haga et al. | |
| 4,351,894 A | 9/1982 | Yonezawa et al. | |
| 4,595,453 A | 6/1986 | Yamazaki et al. | |
| 4,735,920 A | 4/1988 | Stephani et al. | |
| 4,865,685 A | 9/1989 | Palmour | |
| 4,981,551 A | 1/1991 | Palmour | |
| 5,254,215 A | 10/1993 | Terakado et al. | |
| 5,356,478 A | 10/1994 | Chen et al. | |

(Continued)

FOREIGN PATENT DOCUMENTS

DE    4310345    10/1994

(Continued)

OTHER PUBLICATIONS

Lo et al., Reactive Ion Etching of a-SiC:H Films Using $CCl_4$ and $O_2$ Gas Mixture, Journal of Vacuum Science and Technology: Part A, American Institute of Physics, 1993, vol. 11, No. 2, New York, USA.

(Continued)

*Primary Examiner*—Duy-Vu N Deo
(74) *Attorney, Agent, or Firm*—Buchanan Ingersoll & Rooney PC (57) ABSTRACT

A process for plasma etching silicon carbide with selectivity to an overlying and/or underlying dielectric layer of material. The dielectric material can comprise silicon dioxide, silicon oxynitride, silicon nitride or various low-k dielectric materials including organic low-k materials. The etching gas includes a chlorine containing gas such as $Cl_2$, an oxygen containing gas such as $O_2$, and a carrier gas such as Ar. In order to achieve a desired selectivity to such dielectric materials, the plasma etch gas chemistry is selected to achieve a desired etch rate of the silicon carbide while etching the dielectric material at a slower rate. The process can be used to selectively etch a hydrogenated silicon carbide etch stop layer or silicon carbide substrate.

26 Claims, 5 Drawing Sheets

U.S. PATENT DOCUMENTS

| | | |
|---|---|---|
| 5,626,775 A | 5/1997 | Roberts |
| 5,647,953 A | 7/1997 | Williams et al. |
| 5,681,424 A | 10/1997 | Saito et al. |
| 5,756,400 A | 5/1998 | Ye et al. |
| 5,770,523 A | 6/1998 | Hung et al. |
| 5,817,578 A | 10/1998 | Ogawa |
| 5,820,723 A | 10/1998 | Benjamin et al. |
| 5,928,967 A | 7/1999 | Radens et al. |
| 5,981,551 A | 11/1999 | Luengo et al. |
| 6,040,248 A | 3/2000 | Chen et al. |
| 6,074,514 A | 6/2000 | Bjorkman et al. |
| 6,090,304 A | 7/2000 | Zhu et al. |
| 6,103,590 A | 8/2000 | Swanson et al. |
| 6,136,211 A | 10/2000 | Qian et al. |
| 6,153,935 A | 11/2000 | Edelstein et al. |
| 6,211,032 B1 | 4/2001 | Redford et al. |
| 6,261,892 B1 | 7/2001 | Swanson |
| 6,284,149 B1 | 9/2001 | Li et al. |
| 6,284,657 B1 | 9/2001 | Chooi et al. |
| 6,387,819 B1 | 5/2002 | Yu |
| 6,399,424 B1 | 6/2002 | Matuura et al. |
| 6,528,426 B1 | 3/2003 | Olsen et al. |
| 6,617,244 B2 | 9/2003 | Nishizawa |
| 6,743,725 B1 | 6/2004 | Hu et al. |
| 2003/0220708 A1* | 11/2003 | Sahin et al. ................ 700/121 |

FOREIGN PATENT DOCUMENTS

| | | |
|---|---|---|
| EP | 0600664 | 6/1994 |
| EP | 0926715 | 6/1999 |
| JP | 63-152125 | 6/1998 |
| JP | 2001102447 | 4/2001 |
| WO | WO99/52135 | 10/1999 |

OTHER PUBLICATIONS

Notification of Transmittal of the International Search Report or the Declaration for PCT/US02/21863 dated Jan. 29, 2003.

Moalem et al., Low-Temperature Vapor-Phase Etching of Silicon Carbide by Dioxygen Difluoride, Appl. Phys. Lett. , 1995, pp. 3480-3482, vol. 66 (25), American Institute of Physics, New York, USA.

* cited by examiner

Pre-etch Condition

FIG. 1A

Post-etch Condition

FIG. 1B

Re-patterned for Trench

FIG. 1C

Post-etch Condition

Pre-etch Condition

FIG. 3A

Post-etch Condition

PLASMA ETCHING OF SILICON CARBIDE

This application is a continuation of application Ser. No. 09/820,696, filed on Mar. 30, 2001, now abandoned.

FIELD OF THE INVENTION

The present invention relates to an improved process of plasma etching dielectric materials such as silicon carbide.

BACKGROUND OF THE INVENTION

The manufacture of multilayer structures typically involves patterned etching of areas of the semiconductor surface that are covered by a photoresist protective material. One etching technique is reactive ion etching (RIE). This process involves positioning a semiconductor wafer in a reaction chamber and feeding etchant gases into the chamber. The etchant gases are dissociated in a radio frequency (RF) field so that ions contained in the etchant gases are accelerated to the wafer surface. The accelerated ions combine chemically with unmasked material on the wafer surface. As a result, volatile etch product is produced and is incorporated into the plasma. The concentration of the volatile etch product can be tracked in order to determine the end-point of the RIE process, i.e., when the chemical reaction has removed the desired level of material from the wafer surface. During the RIE process, a single layer or multiple layers of material or film may be removed. These materials may include, for example, silicon nitride ($Si_3N_4$), PSG, silicon dioxide ($SiO_2$) and poly-silicon (PSi).

U.S. Pat. No. 3,398,033, issued to Haga, discusses wet etching of silicon carbide by the use of a chemical reaction of a mixture of oxygen ($O_2$) and chlorine ($Cl_2$) heated to between 1200° C. and 1300° C. U.S. Pat. No. 4,351,894, issued to Yonezawa, discloses a plasma etch process for removing SiC using carbon tetrafluoride ($CF_4$) and optionally oxygen ($O_2$). U.S. Pat. No. 4,595,453, issued to Yamazaki, discloses using hydrogen fluoride gas (HF) in a dry etch plasma process.

U.S. Pat. Nos. 4,865,685 and 4,981,551, both issued to Palmour, disclose reactive ion etching of SiC using $NF_3$ and, alternatively, $NF_3$ mixed with $O_2$ and argon (Ar).

There is a need in the art for improved techniques for plasma etching of silicon carbide with selectivity to overlying photoresist or hard mask and/or dielectric layers overlying or underlying a silicon carbide layer.

SUMMARY OF THE INVENTION

A method of plasma etching a layer of silicon carbide with selectivity to an underlying and/or an overlying dielectric material is provided. A substrate, including a layer of silicon carbide and an underlying and/or an overlying layer of dielectric material, is positioned in a reactor chamber and an etchant gas of a chlorine containing gas, an oxygen containing gas, and optional carrier gas are supplied to the chamber and energized into a plasma state. The plasma etches openings in the silicon carbide layer and the silicon carbide layer is etched at a faster rate than the dielectric material.

The substrate may be a silicon wafer and may include a patterned silicon dioxide hard mask and layer of low-k dielectric above and/or below the silicon carbide layer. A low-k dielectric above the silicon carbide layer may be previously etched to expose the silicon carbide layer at locations corresponding to openings in the hard mask. The low-k dielectric material may be an organic polymer material.

The method preferably provides a silicon carbide etch rate of at least 1200 Å/min and a silicon carbide:dielectric etch rate selectivity ratio of at least 10 and may be used in a reactor chamber such as an ECR plasma reactor, an inductively coupled plasma reactor, a capacitively coupled reactor, a helicon plasma reactor or a magnetron plasma reactor. The method may be used to etch openings in a substrate, such as vias, contacts, and/or trenches and may be used as an etch method to form a single or dual damascene structure or self-aligned contact or trench structure.

The chlorine containing gas may be $Cl_2$ or $BCl_3$, the oxygen containing gas may be $O_2$, CO, or $CO_2$ and the carrier gas may be He, Ne, Ar, Kr, or Xe. The chlorine and oxygen gases may be supplied to the reactor chamber at a flow rate ratio of $Cl_2$:$O_2$ of 2:1 to 3:1. The oxygen containing gas may be supplied to the reactor chamber at a rate of 5 to 30 sccm, preferably at a rate of 15 to 25 sccm; and the carrier gas may be supplied to the reactor chamber at a rate of 10 to 80 sccm preferably at a rate of 40 to 60 sccm.

BRIEF DESCRIPTION OF THE DRAWING FIGURES

The objects and advantages of the invention will become apparent from the following detailed description of preferred embodiments thereof in connection with the accompanying drawings in which like numerals designate like elements and in which.

DETAILED DESCRIPTION OF PREFERRED EMBODIMENTS

The invention provides a process for plasma etching silicon carbide (SiC) with selectivity to an overlapping and/or underlying dielectric layer of material. The dielectric material can comprise various low-k dielectric materials, including organic low-k materials, inorganic dielectric materials, silicon dioxide, silicon oxynitride, silicon nitride, or the like. In order to achieve a desired selectivity to such dielectric materials, the plasma etch gas chemistry is selected to achieve a desired etch rate of the silicon carbide while etching the dielectric material at a slower rate.

Silicon carbide has favorable characteristics as a semiconductor material, including its wide bandgap, high thermal conductivity, high saturated electron drift velocity, and high electron mobility. These characteristics make SiC an attractive dielectric material for integrated circuits. Additionally, SiC has found application as etch stops, protective coatings, masks, diffusion barriers, and the like due to its relative resistance to ceratin types of etchants utilized in multilayer integrated circuit manufacturing. However, there are certain difficulties working with silicon carbide, including high process temperatures, impurity of starting materials, difficulty with certain doping techniques, and limited development of suitable etching techniques with high selectivity ratios.

The invention provides a semiconductor manufacturing process wherein openings can be plasma etched in silicon carbide layers while providing desired selectivity to underlying and/or overlying dielectric layers such as silicon dioxide ($SiO_2$), silicon nitride ($Si_3N_4$), silicon oxynitride and photoresist materials (PR). Such selectivity is of great interest in the manufacture of damascene structures wherein one or more silicon carbide etch stop layers are incorporated in a multilayer structure. During manufacture of such structures, features such as contacts, vias, conductor lines, etc. are etched in dielectric materials such as oxide and organosilicate glass layers in the manufacture of integrated circuits. The invention overcomes a problem with prior etching techniques wherein the selectivity between the silicon carbide and the overlying and/or underlying layers such as mask/oxide/low-k dielectric/photoresist layers was too low for commercial applications. Such selectivity problems are solved by utilizing an etching gas chemistry which reduces the etch rates of such layers relative to the silicon carbide material.

According to one aspect of the invention, in the manufacture of a single or dual-damascene structure wherein a low-k dielectric layer is etched with 0.25 μm or smaller geometry to an etch depth of at least 1.8 μm, a silicon carbide etch stop layer is etched with a silicon carbide:low-k dielectric/photoresist/oxide etch rate selectivity of greater than 5:1. Such structures can include a hard mask having a thickness of around 40 to 60 nm, low-k dielectric layers having thicknesses of around 200 to 400 nm, etch stop layers having a thickness of around 40 to 60 nm, barrier layers having a thickness of around 40 to 60 nm, metallization layers, metallization filled vias and trenches, and the like. In the following description, silicon carbide may be used for one or more layers of various damascene structures. However, the process of the invention is applicable to any integrated circuit structure wherein silicon carbide is used as an etched component of the structure.

Figures 1A, 1B:
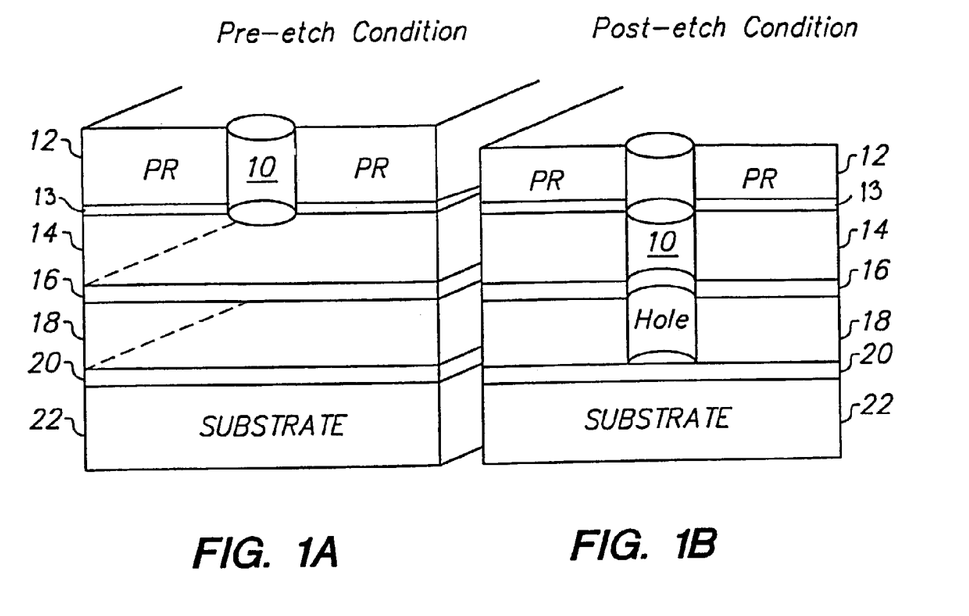
FIGS. 1A–D show schematic representations of a via-first dual-damascene structure which can be etched according to the process of the invention, FIG. 1A showing a pre-etch condition, FIG. 1B showing a post-etch condition in which a via has been etched, FIG. 1C showing the structure re-patterned for a trench etch and FIG. 1D showing a post-etch condition in which the trench has been etched.
Figures 1C, 1D:
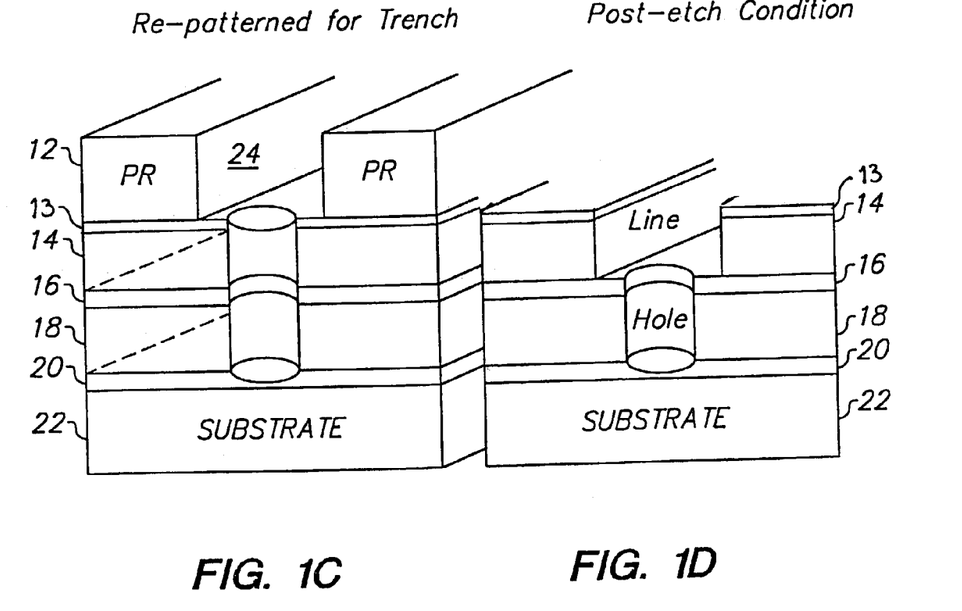

FIGS. 1A–D show schematics of how a silicon carbide layer can be etched during a via first dual-damascene etch process. FIG. 1A shows a pre-etch condition wherein an opening 10 corresponding to a via is provided in a photoresist 12 which overlies a stack of layers including a mask 13 of silicon dioxide, silicon nitride, silicon carbide, silicon nitride, or the like, a first low-k dielectric layer 14, a first stop layer 16 such as silicon nitride or silicon carbide, a second low-k dielectric layer 18, a second stop layer 20 such as silicon nitride or silicon carbide, and a substrate 22 such as a silicon wafer which may include an electrically conductive layer (not shown) and other layers such as barrier layers (not shown) beneath the etch stop layer 20. FIG. 1B shows the structure after etching wherein the opening 10 extends through the mask 13, the low-k dielectric layers 14, 18 and first stop layer 16 to the second stop layer 20. FIG. 1C shows the structure after re-patterning the masking layer for a trench 24. FIG. 1D shows the structure after stripping of the photoresist and etching wherein the first low-k dielectric layer 14 is etched down to the first stop layer 16.

Figure 2A:
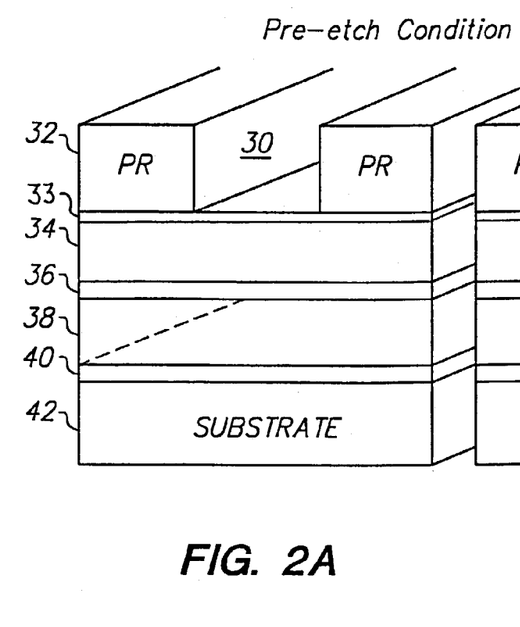
FIGS. 2A–D show schematic representations of a trench-first dual-damascene structure which can be etched according to the process of the invention, FIG. 2A showing a pre-etch condition, FIG. 2B showing a post-etch condition in which a trench has been etched, FIG. 2C showing the structure re-patterned for a via etch and FIG. 2D showing a post-etch condition in which the via has been etched.
Figure 2B:
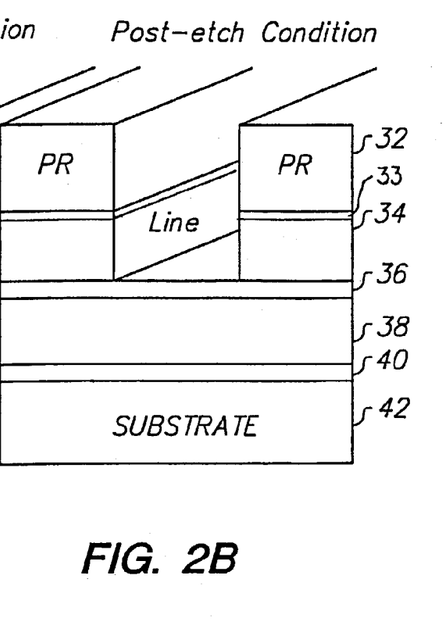
Figure 2C:
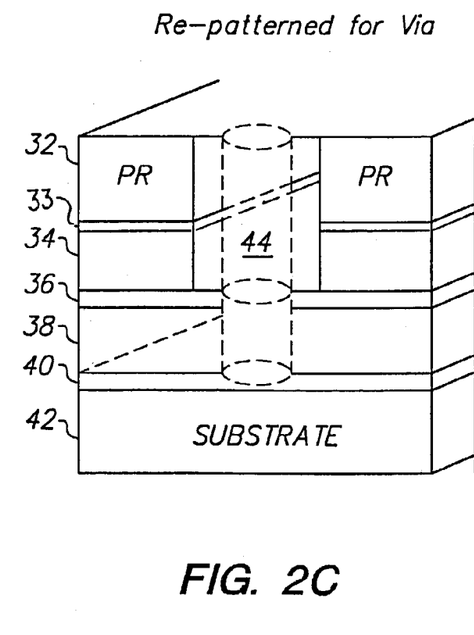
Figure 2D:
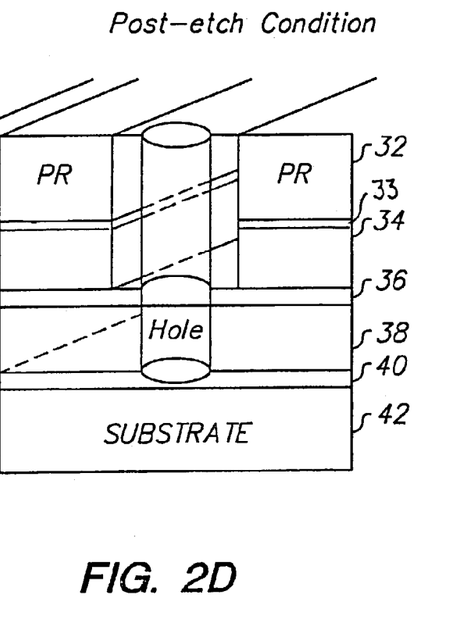

FIGS. 2A–D show schematics of how a silicon carbide layer can be etched during a trench-first dual-damascene etch process. FIG. 2A shows a pre-etch condition wherein an opening 30 corresponding to a trench is provided in a photoresist masking layer 32 which overlies a stack of layers including a mask layer 33, a first low-k dielectric layer 34, a first stop layer 36 such as silicon nitride or silicon carbide, a second low-k dielectric layer 38, a second stop layer 40 such as silicon nitride or silicon carbide, and a substrate 42 such as a silicon wafer which may further include metallization and barrier layers (not shown) beneath the stop layer 40. FIG. 2B shows the structure after etching wherein the opening 30 extends through the low-k dielectric layer 34 to the first stop layer 36. FIG. 2C shows the structure after re-patterning for a via 44. FIG. 2D shows the structure after etching wherein the second low-k dielectric layer 38 is etched down to the second stop layer 40.

Figure 3A:
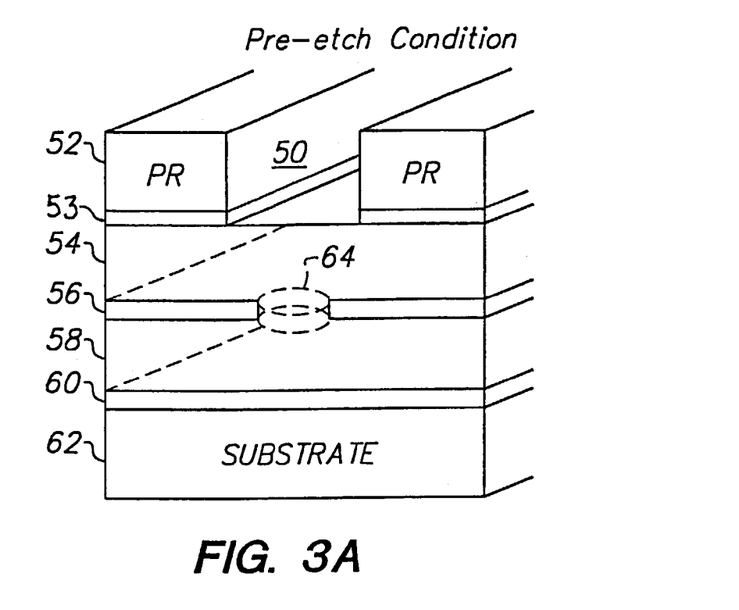
FIGS. 3A–B show schematic representations of a self-aligned dual-damascene structure which can be etched according to the process of the invention, FIG. 3A showing a pre-etch condition and FIG. 3B showing a post-etch condition in which a trench and a via have been etched.
Figure 3B:
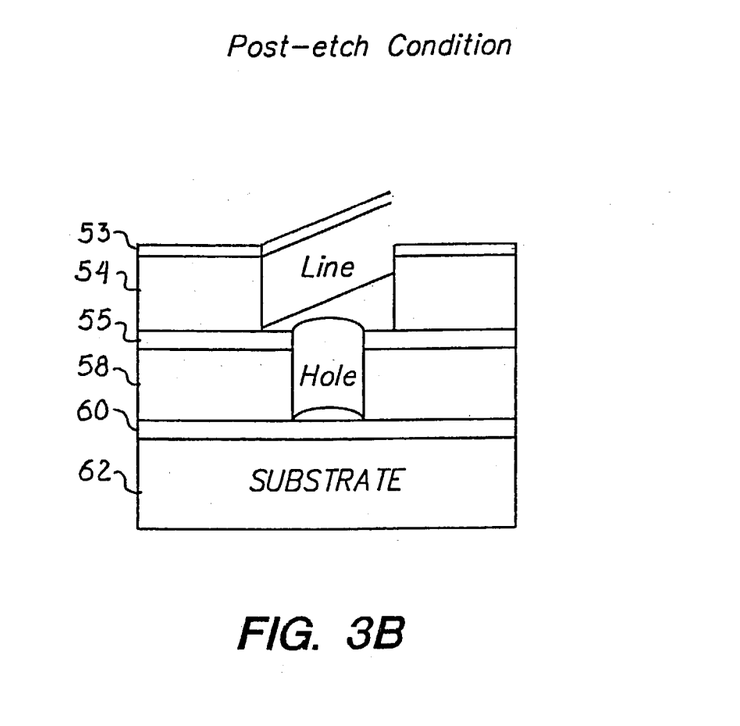

FIGS. 3A–B show schematics of how a silicon carbide layer can be etched during a single step dual-damascene etch process. FIG. 3A shows a pre-etch condition wherein an opening 50 corresponding to a trench is provided in a photoresist 52 and a masking layer 53 which overlies a stack of layers including a first low-k dielectric layer 54, a first stop layer 56 such as silicon nitride or silicon carbide, a second low-k dielectric layer 58, a second stop layer 60 such as silicon nitride or silicon carbide, and a substrate 62 such as a silicon wafer which can include metallization and barrier layers (not shown) beneath the stop layer 60. In order to obtain etching of vias through the first stop layer 56 in a single etching step, first stop layer 56 includes an opening 64. FIG. 3B shows the structure after etching wherein the opening 50 extends through the low-k dielectric layer 54 to the first stop layer 56 and the opening 64 extends through the second low-k dielectric 58 to the second stop layer 60. Such an arrangement can be referred to as a "self-aligned dual-damascene" structure.

The process of the invention is applicable to etching of silicon carbide layers in damascene or other integrated circuit structures including etching of silicon carbide layers in the form of substrates. The process of the invention is particularly useful in manufacturing multilayer structures which include various low-k dielectric layers including doped silicon oxide such as fluorinated silicon oxide (FSG), silicate glasses such as boron phosphate silicate glass (BPSG) and phosphate silicate glass (PSG), organic polymer materials such as polyimide, organic siloxane polymer, poly-arylene ether, carbon-doped silicate glass, silsesquioxane glass, fluorinated and non-fluorinated silicate glass, diamond-like amorphous carbon, aromatic hydrocarbon polymer such as SiLK (a product available from Dow Chemical Co.), c-doped silica glass such as CORAL (a product available from Novellus Systems, Inc.), or other suitable dielectric material having a dielectric constant below 4.0, preferably below 3.0. Such low-k dielectric layers can overlie an intermediate layer such as a barrier layer and a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) etch reactor available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,723, the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

Figure 4:
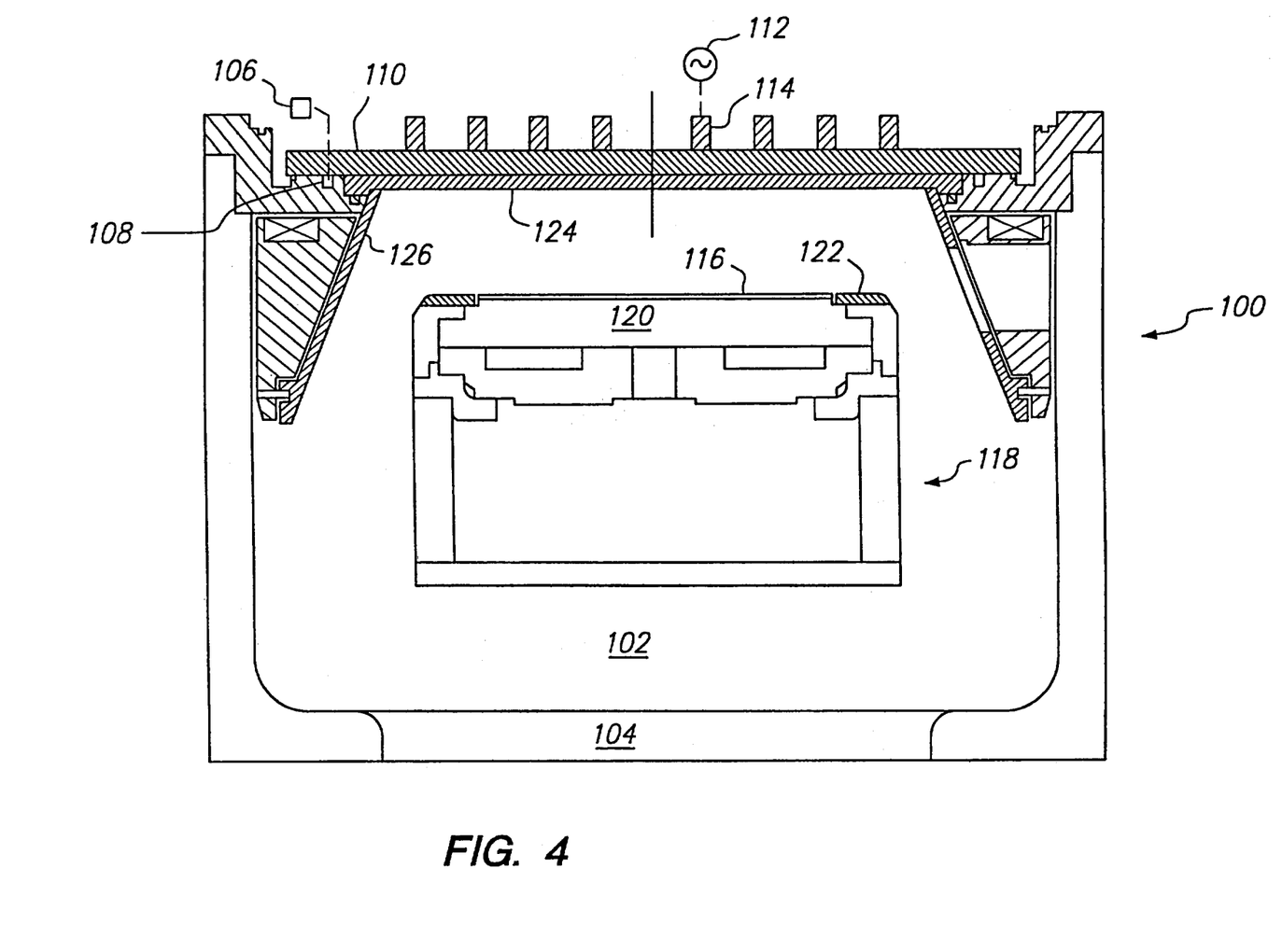
FIG. 4 shows a schematic representation of an inductively coupled high density plasma reactor which can be used to carry out the process of the invention.

The process of the invention can be carried out in an inductively coupled plasma reactor such as reactor 100 shown in FIG. 4. The reactor 100 includes an interior 102 maintained at a desired vacuum pressure by a vacuum pump connected to an outlet 104 in a lower wall of the reactor. Etching gas can be supplied to a showerhead arrangement be supplying gas from gas supply 106 to a plenum 108 extending around the underside of a dielectric window 110. A high density plasma can be generated in the reactor by supplying RF energy from an RF source 112 to an external RF antenna 114 such as a planar spiral coil having one or more turns outside the dielectric window 110 on top of the reactor. The plasma generating source can be part of a modular mounting arrangement removably mounted in a vacuum tight manner on the upper end of the reactor.

A semiconductor substrate 116 such as a wafer is supported within the reactor on a substrate support 118 such as a cantilever chuck arrangement removably supported by a modular mounting arrangement from a sidewall of the reactor. The substrate support 118 is at one end of a support arm mounted in a cantilever fashion such that the entire substrate support/support arm assembly can be removed from the reactor by passing the assembly through an opening in the sidewall of the reactor. The substrate support 118 can include a chucking apparatus such as an electrostatic chuck 120 and the substrate can be surrounded by a dielectric focus ring 122. The chuck can include an RF biasing electrode for applying an RF bias to the substrate during an etching process. The etching gas supplied by gas supply 106 can flow through channels between the window 110 and an underlying gas distribution plate 124 and enter the interior 102 through gas outlets in the plate 124. The reactor can also include a cylindrical or conical heated liner 126 extending from the plate 124.

Figure 5:
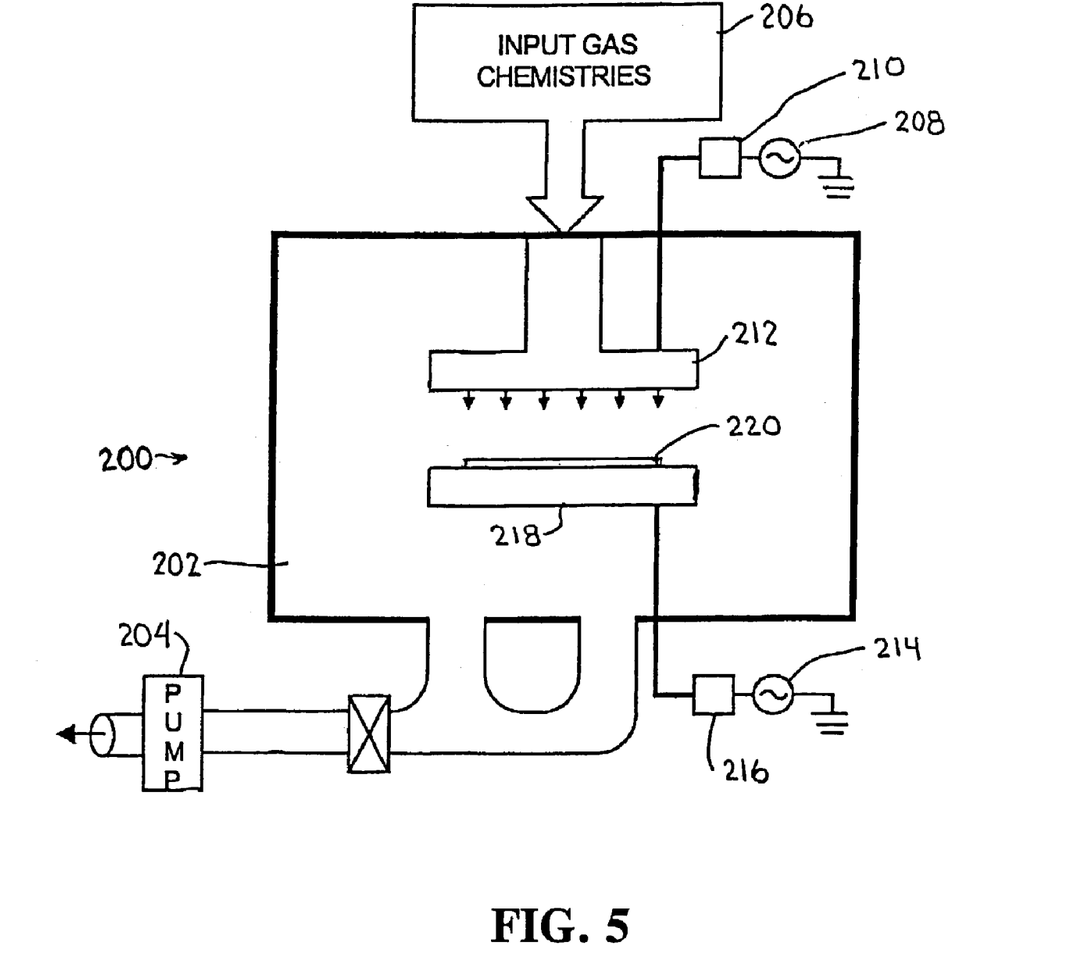
FIG. 5 shows a schematic representation of a medium density parallel plate plasma reactor which can be used to carry out the process of the invention.

The process of the invention can also be carried out in a parallel plate plasma reactor such as reactor 200 shown in FIG. 5. The reactor 200 includes a chamber having an interior 202 maintained at a desired vacuum pressure by a vacuum pump 204 connected to an outlet in a wall of the reactor. Etching gas can be supplied to a showerhead electrode by supplying gas from gas supply 206. A medium density plasma can be generated in the reactor by a dual frequency arrangement wherein RF energy from RF source 208 is supplied through a match network 210 to a showerhead electrode 212 and RF energy from RF source 214 is supplied through a match network 216 to a bottom electrode 218. Alternatively, the showerhead electrode 212 can be electrically grounded and RF energy at two different frequencies can be supplied to the bottom electrode 218. A substrate 220 supported on the bottom electrode 218 can be etched with plasma generated by energizing the etch gasses into a plasma state. Other capacitively coupled reactors can also be used such as reactors wherein RF power is supplied only to a showerhead electrode or to a bottom electrode.

An example of an etch process carried out in a dual frequency medium density parallel plate plasma chamber is set forth in Table 1 wherein the etchant gas chemistry is a $Cl_2/O_2/Ar$ mixture. Although the optimal flow rates and ratios of this gas mixture may change depending on the choice of plasma etch chamber, substrate size, etc., in-the case of etching a damascene structure on a 200 mm silicon wafer, the individual constituents of the etchant gas can be supplied to the reactor chamber at flow rates of: 5 to 100 sccm, and more preferably 20 to 60 sccm $Cl_2$; 2 to 50 sccm and more preferably 10 to 30 sccm $O_2$; and 0 to 500 sccm, and more preferably 200 to 300 sccm Ar. During etching, the chamber pressure can be set at 1 to 500 mTorr, preferably 50 to 200 mTorr. The flow rate of the $Cl_2$ preferably exceeds the flow rate of the $O_2$. However, the flow rate of the $Cl_2$ can be less than the flow rate of the $O_2$. For example, the ratio of the flow rate of $Cl_2$ to the flow rate of $O_2$ can be set at 0.5 to 2.0, more preferably 1.25 to 1.75 to achieve a desired degree of selectivity with respect to other layers of the etched structure.

TABLE 1

| Etchant Gas Component | Supply Rate (sccm) | Chamber Pressure (mTorr) | Top RF Power (W) | Bottom RF Power (W) | SiC Etch Rate (Å/min) |
| --- | --- | --- | --- | --- | --- |
| $Cl_2$ | 40 | 5 | 360 | 60 | 1400 |
| $O_2$ | 20 | | | | |
| Ar | 50 | | | | |

The above etching process can be modified by substituting different gases for the $Cl_2$, $O_2$ and/or Ar. For example, other Cl-containing gases such as $BCl_3$ can be substituted for or added to the $Cl_2$, carbon monoxide (CO) or carbon dioxide ($CO_2$) can be substituted for or added to the $O_2$, and other inert gases can be substituted for or added to the Ar.

In the process utilizing the parameters of Table 1, the silicon carbide layer was located between dielectric layers of $SiO_2$ and $Si_3N_4$. Using RF powers of 360 watts for the showerhead electrode and 60 watts for the bottom electrode, the etch rate of the silicon carbide layer was about 1400 angstroms per minute (Å/min) while providing a selectivity ratio of $SiC:SiO_2$ and SiC:SiN of at least 10, preferably at least 20.

The high SiC:dielectric selectivity can be obtained using other dielectric materials such as low-k organic dielectrics such as polyimide, an organic siloxane polymer, polyarylene ether, carbon-doped silicate glass or silsesquioxane glass, spin-on glass, fluorinated or non-fluorinated silicate glass, diamond-like amorphous carbon, aromatic hydrocarbon polymer, such as "SILK," a trademark of Dow Chemical Co., or any similar low dielectric constant (low-k) material known in the art to be useful as a dielectric material.

Further, as is known to those familiar with plasma science, a plasma can be formed under a number of gas pressure and electric power conditions. It should be understood, therefore, that the selection of temperatures, power levels, and gas pressures used in practicing the present invention can vary widely and that those specified herein are given by way of example, and not as limitations on the scope of the invention.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A method of plasma etching a layer of silicon carbide with selectivity to an overlying low-k dielectric material, the method comprising:
   positioning a semiconductor substrate in a reactor chamber, the substrate including a layer of silicon carbide and an overlying layer of low-k dielectric material;
   supplying an etchant gas comprising $Cl_2$, $O_2$ and argon to the chamber, the $Cl_2$ and $O_2$ being supplied at a flow rate ratio that etches the silicon carbide layer with an etch rate selectivity with respect to the overlying low-k dielectric material of at least 5; and
   energizing the etchant gas into a plasma state and forming etched openings in the silicon carbide layer, the etched openings being defined by openings in the overlying low-k dielectric material.

2. The method of claim 1, wherein the etchant gas consists of a $Cl_2/O_2/Ar$ mixture.

3. The method of claim 1, wherein the $Cl_2$ and $O_2$ are supplied to the reactor chamber at a flow rate ratio of at least 2:1.

4. The method of claim 1, wherein the $Cl_2$ is supplied to the reactor chamber at a rate of 5 to 50 sccm.

5. The method of claim 4, wherein the $O_2$ is supplied to the reactor chamber at a rate of 2 to 25 sccm.

6. The method of claim 1, wherein the argon is supplied to the reactor chamber at a rate of 10 to 400 sccm.

7. The method of claim 6, wherein the argon is supplied to the reactor chamber at a rate of 25 to 100 sccm.

8. The method of claim 1, wherein the silicon carbide etch rate is at least 1200 Å/min.

9. The method of claim 1, wherein the substrate includes a patterned silicon dioxide hard mask and the layer of low-k dielectric above the silicon carbide layer, the low-k dielectric having been previously etched to expose the silicon carbide layer at locations corresponding to openings in the hard mask, the silicon carbide comprising an etch stop layer etched with an etch rate selectivity to the hard mask of at least 5.

10. The method of claim 9, wherein the substrate further includes a layer of low-k dielectric below the silicon carbide layer.

11. The method of claim 10, wherein the low-k dielectric material comprises an organic polymer material and the silicon carbide comprises hydrogenated silicon carbide.

12. The method of claim 1, wherein a silicon carbide: low-k dielectric material etch rate selectivity ratio is at least 10.

13. The method of claim 1, wherein the reactor chamber comprises an ECR plasma reactor, an inductively coupled plasma reactor, a capacitively coupled reactor, a helicon plasma reactor or a magnetron plasma reactor.

14. The method of claim 1, wherein the openings comprise vias, contacts, and/or trenches.

15. The method of claim 1, wherein the openings are in a single or dual damascene structure.

16. The method of claim 1, wherein the chamber pressure in the reactor chamber is 5 to 500 mTorr.

17. The method of claim 1, wherein the silicon carbide layer overlies a copper layer.

18. The method of claim 1, wherein the total gas flow of the $Cl_2$ and $O_2$ is above 50 sccm.

19. The method of claim 1, wherein the total gas flow of the $Cl_2$ and $O_2$ is at least 100 sccm.

20. A method of plasma etching a layer of silicon carbide with selectivity to an overlying low-k dielectric material, comprising:
   positioning a semiconductor substrate in a reactor chamber of a dual frequency, medium-density parallel plate plasma etch reactor, the substrate including a layer of silicon carbide and an overlying layer of low-k dielectric material;
   supplying an etchant gas comprising $Cl_2$, $O_2$ and argon to the chamber the reactor chamber being at a pressure of from 5 mTorr to 200 mTorr, the $Cl_2$ being supplied at a flow rate of 5 to 100 sccm, the $O_2$ being supplied at a flow rate of 2 to 50 sccm, and the $Cl_2$ and $O_2$ being supplied at a flow rate ratio that etches the silicon carbide layer with a desired degree of selectivity with respect to the overlying low-k dielectric material; and
   energizing the etchant gas into a plasma state and forming etched openings in the silicon carbide layer, the etched openings being defined by openings in the overlying low-k dielectric material, the silicon carbide layer being etched at a faster rate than the overlying low-k dielectric material.

21. The method of claim 20, wherein the openings have a size of 0.25 μm or less.

22. The method of claim 20, wherein the dielectric material is a doped silica glass.

23. The method of claim 20, wherein the dielectric material has a dielectric constant below 3.0.

24. The method of claim 20, wherein the $Cl_2$ and $O_2$ are supplied to the reactor chamber at a flow rate ratio of from about 10:1 to about 20:1.

25. A method of plasma etching a layer of silicon carbide with selectivity to an overlying low-k dielectric material, the method comprising:
   supplying an etchant gas to a reactor chamber containing a substrate including a layer of silicon carbide and an overlying layer of low-k dielectric material, the etchant gas comprising $Cl_2$, $O_2$ and argon and the $Cl_2$ and $O_2$ being supplied to the reactor chamber at a flow rate ratio of from about 5:1 to about 20:1; and
   energizing the etchant gas into a plasma state and forming etched openings in the silicon carbide layer defined by openings in the overlying low-k dielectric material, the silicon carbide layer being etched at a faster rate than the overlying low-k dielectric material.

26. The method of claim 25, wherein the $Cl_2$ and $O_2$ are supplied to the reactor chamber at a flow rate ratio of from about 5:1 to about 10:1.

* * * * *

UNITED STATES PATENT AND TRADEMARK OFFICE
CERTIFICATE OF CORRECTION

| | | |
|---|---|---|
| PATENT NO. | : 7,166,535 B2 | Page 1 of 1 |
| APPLICATION NO. | : 10/430013 | |
| DATED | : January 23, 2007 | |
| INVENTOR(S) | : Si Yi Li et al. | |

It is certified that error appears in the above-identified patent and that said Letters Patent is hereby corrected as shown below:

Column 7, Claim 8, line 41 of the claim, "Å/mm" should read --Å/min--.

Signed and Sealed this

Seventeenth Day of April, 2007

JON W. DUDAS
*Director of the United States Patent and Trademark Office*